(12) United States Patent
Lin et al.

(10) Patent No.: US 7,544,524 B2
(45) Date of Patent: Jun. 9, 2009

(54) ALTERNATING CURRENT LIGHT-EMITTING DEVICE

(75) Inventors: Ming-Te Lin, Hsinchu Hsien (TW); Hsi-Hsuan Yen, Hsinchu (TW); Wen-Yung Yeh, Hsinchu (TW); Ming-Yao Lin, Hsinchu (TW); Sheng-Pan Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/432,366

(22) Filed: May 12, 2006

(65) Prior Publication Data

US 2007/0080355 A1  Apr. 12, 2007

Related U.S. Application Data

(63) Continuation-in-part of application No. 11/245,255, filed on Oct. 7, 2005, now Pat. No. 7,474,681.

(30) Foreign Application Priority Data

May 13, 2005 (TW) .............................. 94115514 A
Mar. 20, 2006 (TW) .............................. 95109419 A

(51) Int. Cl.
*H01L 21/00* (2006.01)

(52) U.S. Cl. ...................... 438/22; 438/24; 438/604; 257/E31.001

(58) Field of Classification Search ............. 438/22–29
See application file for complete search history.

(56) References Cited

U.S. PATENT DOCUMENTS

| | | | |
|---|---|---|---|
| 2004/0206970 A1* | 10/2004 | Martin | 257/98 |
| 2004/0246696 A1 | 12/2004 | Yoo | |
| 2005/0001537 A1 | 1/2005 | West et al. | |
| 2005/0110029 A1* | 5/2005 | Aoyagi et al. | 257/94 |
| 2006/0044864 A1* | 3/2006 | Lin et al. | 365/151 |
| 2006/0087230 A1* | 4/2006 | Ghosh et al. | 313/512 |

FOREIGN PATENT DOCUMENTS

JP 2004-333583 A 11/2004

\* cited by examiner

*Primary Examiner*—Hsien-ming Lee
(74) *Attorney, Agent, or Firm*—Finnegan, Henderson, Farabow, Garrett & Dunner LLP

(57) ABSTRACT

An alternating current light-emitting device and the fabrication method thereof is disclosed. The alternating current light-emitting device includes at least one alternating current micro-die light-emitting module formed on a substrate and composed of at least two micro-dies connected to one another. The micro-dies, each includes at least two active layers, are electrically connected by a conductive structure, such that the active layers of the micro-dies take turns emitting light during positive and negative half cycles of alternating current, thereby providing a full-scale light-emitting area for all-time light emission.

60 Claims, 12 Drawing Sheets

ALTERNATING CURRENT LIGHT-EMITTING DEVICE

This application is a Continuation-In-Part of application Ser. No. 11/245,255 filed on Oct. 7, 2005, now U.S. Pat No. 7,474,681, and for which priority is claimed under 35 U.S.C. § 120, and this application claims priority of Application No. 095109419 filed in Tawian, R.O.C. on Mar. 20, 2006 and Application No. 094115514 filed in Taiwan, R.O.C. ON May 13, 2005 under 35 U.S.C. § 119; the entire contents of all are hereby incorporated by reference.

BACKGROUND OF THE INVENTION

1. Field of the Invention

The present invention relates to a light-emitting device, and more particularly, to an alternating current light emitting device and the fabrication method thereof.

2. Description of Related Art

Unlike the light emission principle of white light, the light emission principle of light emitting diodes (LEDs) involves applying electric current to light-emitting materials so as to produce light. Hence, LEDs are also known as cold light sources. LEDs have their own advantages, namely highly durable, longevity, light and compact, low power consumption, absence of harmful substances such as mercury, and so forth, thus the development of LED-based solid state lighting has become one of the crucial research targets for the global lighting industry as well as the semiconductor industry. Common applications of LEDs include white light illumination, indicator lights, vehicle signal and illuminating lights, flash lights, LED back-light modules, projector light sources, outdoor displays, and so forth.

White light devices, the most important lighting application, still require a patented fabrication process of Nichia fluorescent powder. In addition to the necessity of paying royalties, drawbacks of the patented Nichia process include the distribution ratio of fluorescent powder and the relatively high color temperature of white light arising from a coverage process that leads to shortened operating life and even high temperature-induced failure. Moreover, the prior art fails to provide good packaging control, making mass production more difficult.

Taiwanese Patent Application No. 093126201 discloses a light-emitting diode (LED) die structure having an alternating current circuit, comprising at least one alternating current micro-die LED module formed on a chip and composed of two opposite-polarity micro-die LEDs connected in parallel, so as to apply alternating current thereto, such that two micro-die LEDs can, working in turn, emit light during positive and negative half cycles of the AC waveform to overcome the drawback of the prior art, that is, DC-driven light emission occurs in the presence of forward current rather than reverse current, with a view to using alternating current as a power source to greatly promote application of LED elements.

In the foregoing patent, due to the plane array configuration adopted, each micro-die of a LED only emits light under forward or reverse bias within an alternating current cycle. In other words, at every single moment, a light-emitting area merely accounts for a half of the surface area of a chip, while the micro-dies associated with another half of the surface area of the chip are in an off state, resulting in a waste of the light-emitting area. Furthermore, it is necessary to double the current density in order to attain full-plane luminosity.

Further, a micro-die disclosed by the aforesaid patent has an isosceles, right-angle triangular shape with two legs approximately a mere 70 micrometers long each, causing difficulty in the fabrication process where it is necessary to reduce the size of the LEDs in order to meet the need for product miniaturization. Furthermore, since the aforesaid patent involves the use of patented Nichia fluorescent powder, the foregoing drawbacks of high color temperature and a hard-to-control packaging process still exist.

Therefore, there exists an urgent need to develop an innovative alternating current light-emitting device that not only solves the aforesaid drawbacks of the prior art, but also provides a full-scale light-emitting area for all-time, even light emission characterized by low color temperature and a relatively great overlapped range of color temperatures. The proposed alternating current light-emitting device does not use the patented Nichia fluorescent powder, thereby allowing the fabrication process to be carried out more smoothly and the mass production to be more controllable, and in consequence the industrial applicability of the proposed alternating current light-emitting device is enhanced.

SUMMARY OF THE INVENTION

In light of the aforesaid drawbacks of the prior art, a primary objective of the present invention is to provide an alternating current light-emitting device with a full-scale light-emitting area for all-time light emission and the fabrication method thereof.

Another objective of the present invention is to provide an alternating current light-emitting device that does not use any fluorescent powder and the fabrication method thereof.

Yet another objective of the present invention is to provide an alternating current light-emitting device of small size and the fabrication method thereof.

A further objective of the present invention is to provide an alternating current light-emitting device that can emit light evenly.

To achieve the above and other objectives, the present invention provides an alternating current light-emitting device. The alternating current light-emitting device comprises a substrate, an alternating current micro-die light-emitting module, and a conductive structure. Formed on the substrate, the alternating current micro-die light-emitting module comprises at least two micro-dies, and each micro-die comprises at least two active layers. The conductive structure is electrically connected to each micro-die so as to allow the active layers to take turns emitting light during the positive and negative half cycles of alternating current.

The foregoing substrate can be a chip or an insulating substrate. The active layer is a luminescent active layer. The conductive structure comprises a conductor connected to a conductive bridge disposed between the two micro-dies, for example.

Electrical connections between the micro-dies and the active layers thereof comprise series connections and parallel connections. The micro-dies may emit light at identical wavelengths and thereby emit light of identical colors (monochromatic light), or can emit light at different wavelengths to produce mixed light (multichromatic light). Preferably, the active layers of the micro-dies can emit light at different wavelengths in order to form white light by mixing colors together or form various hues by a combination thereof. Based on the variations of the combination, identical active layers of the micro-dies can take turns to emit light during the positive and negative half cycles of alternating current. Alternatively, different active layers of the micro-dies can take turns to emit light during the positive and negative half cycles of alternating current.

In addition, the micro-dies, each of which comprises at least two active layers, are formed on the substrate and fabricated by flip-chip technology, wafer bonding technology, or epitaxy technology.

To achieve the above and other objectives, the present invention further provides an alternating current light-emitting device. The alternating current light-emitting device comprises a substrate, an alternating current micro-die light-emitting module, and a conductive structure. Formed on the substrate, the alternating current micro-die light-emitting module comprises at least two micro-dies, and each micro-die comprises at least two active layers. The conductive structure is electrically connected to each micro-die so as to allow the active layers to take turns emitting light during the positive and negative half cycles of alternating current.

At least one active layer of the aforesaid micro-die is arranged in accordance with the circuit structure of the diodes in a bridge rectifier, and is electrically connected to another so as to form one or more bridge light-emitting units. The bridge light-emitting micro-dies can be disposed in a matrix-like pattern, and the number of the all-time light-emitting micro-dies disposed in the central region is larger than the number of the rectified light-emitting micro-dies disposed in the peripheral region. Preferably, the above-mentioned may further comprise conductive electrodes disposed at the two opposite diagonal corners of the matrix-like pattern, and the conductive electrodes and the bridge light-emitting units are connected to each other in series for connection with an alternating current source.

As regards the foregoing alternating current light-emitting device, the present invention further provides two methods for manufacturing an alternating current light-emitting device. The first method comprises the steps of: providing a substrate; forming at least two active layers on the substrate; forming a plurality of openings in the at least two active layers respectively; covering a periphery of the active layers with a protective layer; forming a plurality of conductive terminals through the protective layer; and forming on the openings a plurality of conductive structures for electrical connection with the active layers such that, after alternating current is applied to the active layers, the active layers take turns emitting light during the positive and negative half cycles of the alternating current.

The second method comprises the steps of: providing a first substrate; forming a first active layer on the first substrate, removing the first substrate, and disposing the first active layer on a second substrate; forming a second active layer on the first active layer, and forming a connective layer between the first active layer and the second active layer; forming a plurality of openings in the first active layer and the second active layer; covering a periphery of the first active layer and the second active layer with a protective layer; forming a plurality of conductive terminals through the protective layer; and forming on the openings a plurality of conductive structures for electrical connection with the first active layer and the second active layer such that, after alternating current is applied to the first active layer and the second active layer, the first and second active layers take turns emitting light during the positive and negative half cycles of the alternating current.

In addition, the present invention further provides another alternating current light-emitting device. The alternating current light-emitting device comprises a substrate, a bridge light-emitting unit, and a conductive structure. The bridge light-emitting unit comprises a plurality of alternating current light-emitting diode micro-dies formed on the substrate, and the micro-dies are disposed in accordance with a pattern of a diode circuit in a bridge rectifier. The conductive structure electrically connects the micro-dies, such that the micro-dies take turns emitting light during the positive and negative half cycles of alternating current. Preferably, the alternating current light-emitting device further comprises a plurality of bridge light-emitting units electrically connected to one another, wherein the bridge light-emitting units are disposed in a matrix-like pattern, and the number of the all-time light-emitting micro-dies disposed in the central region is larger than the number of the rectified light-emitting micro-dies disposed in the peripheral region, thereby providing a full-scale light-emitting area which enables even light emission. In addition, the above-mentioned may further comprise conductive electrodes disposed at the opposite diagonal corners of the matrix-like pattern, and the conductive electrodes and the bridge light-emitting units are connected to each other in series for connection with an alternating current source.

BRIEF DESCRIPTION OF DRAWINGS

The various objectives and advantages of the present invention can be fully understood by reading the following detailed description with reference made to the accompanying drawings, wherein.

DETAILED DESCRIPTION OF PREFERRED EMBODIMENTS

The present invention discloses an alternating current light-emitting device applicable to a chip. In the presence of an applied alternating current (AC), the disclosed alternating current light-emitting device is capable of emitting monochromatic light, white light, or colored light to meet user needs. The monochromatic light or colored light is emitted as a result of all-time light emission occurring to a light-emitting surface of the chip. The preferred embodiment is achieved by general electric supply according to the universal electricity standards, under a voltage of 110V, 100V or 220V, at a frequency of 60 Hz or 50 Hz.

Figure 1A:
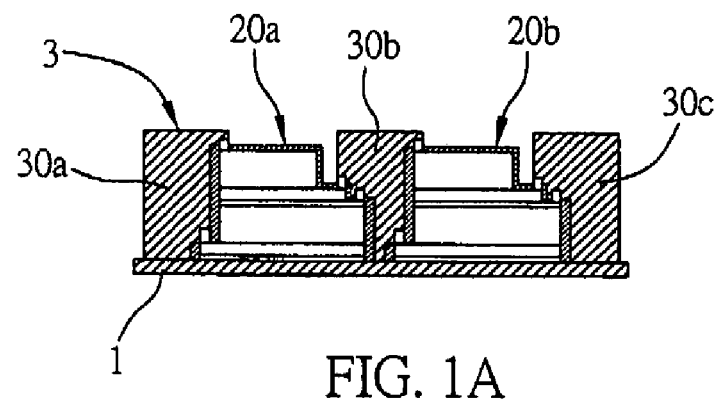
FIGS. 1A and 1B are, respectively, a schematic sectional view and a partially enlarged view of an alternating current light-emitting device according to the present invention.
Figure 1B:
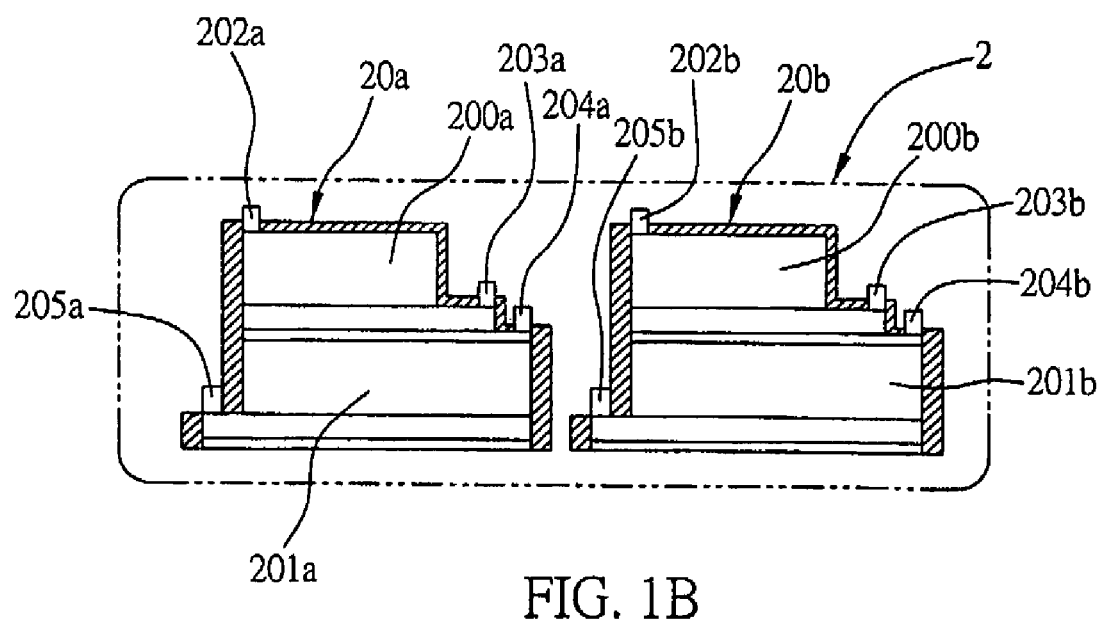

FIGS. 1A and 1B each shows a cross-sectional view of the structure of the alternating current light-emitting device of the present invention. The drawings depict only a single alternating current light-emitting device in this preferred embodiment. The alternating current light-emitting device comprises a substrate 1, an alternating current micro-die light-emitting module 2 formed on the substrate 1, and a conductive structure 3 for providing an electrical connection.

In this preferred embodiment, the substrate 1 can be the chip as mentioned above, or an insulating substrate, such as $Al_2O_3$, GaAs, GaP, SiC, and so forth.

FIG 1B is an enlarged view showing the alternating current micro-die light-emitting module 2 comprising at least two micro-dies 20a and 20b, each micro-die further comprises at least two active layers, namely the upper active layers 200a and 200b and the lower active layers 201a and 201b as shown in the drawing, wherein the active layers are luminescent active layers, and the active layers of the micro-dies 20a and 20b have their respective ohmic electrodes 202a, 202b, 203a, 203b, 204a, 204b, 205a and 205b, such that the active layers can emit light whenever alternating current passes through the ohmic electrodes 202a, 202b, 203a, 203b, 204a, 204b, 205a and 205b. In addition, the micro-dies 20a and 20b, each having at least two active layers, are formed on the substrate 1 and fabricated by flip-chip technology, wafer bonding technology, or epitaxy technology.

The conductive structure 3 is electrically connected to the micro-dies 20a and 20b such that, after alternating current is applied to the active layers of the micro-dies 20a and 20b, the active layers can take turns to emit light during the positive and negative half cycles of alternating current, wherein the conductive structure 3 comprises a conductor 30b disposed between and connecting the two micro-dies. As shown in FIG. 1A, the conductive structure 3 further comprises conductors 30a and 30c for connection with an alternating current source. In the preferred embodiment, the conductors 30a, 30b, and 30c are conductive bridges.

Figure 2A:
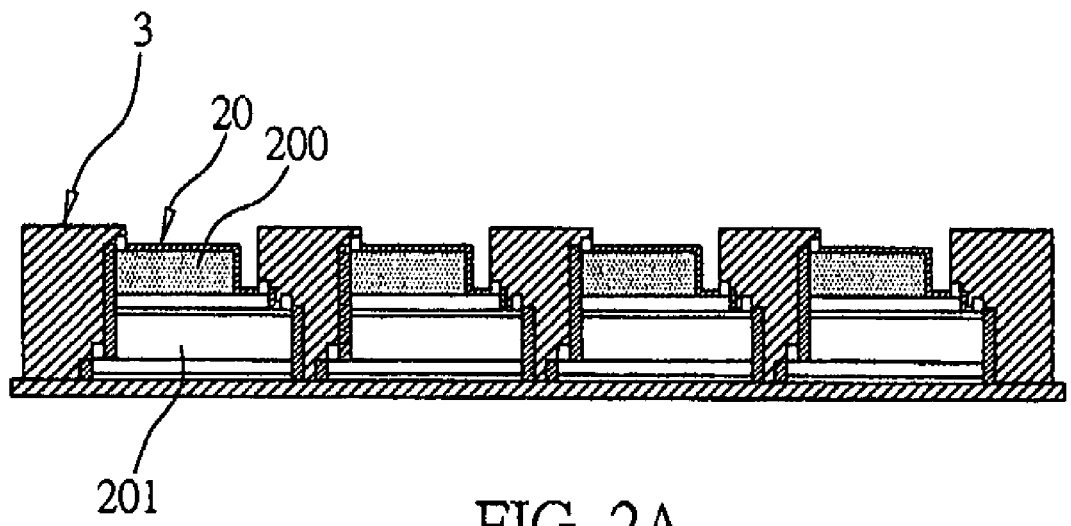
FIGS. 2A and 2B are schematic views illustrating the operation of a preferred embodiment of the alternating current light-emitting device according to the present invention.
Figure 2B:
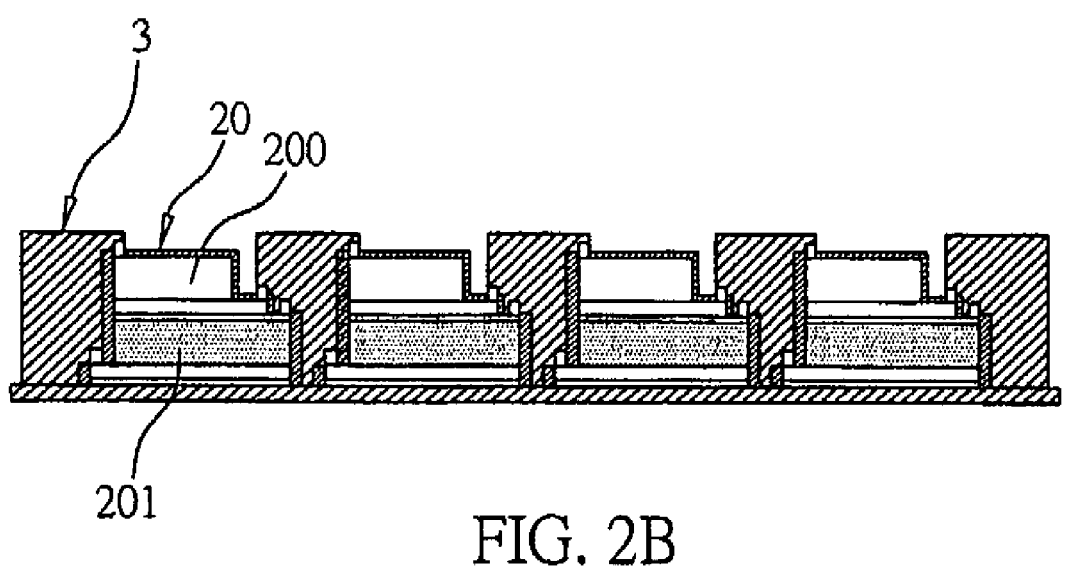
Figure 3A:
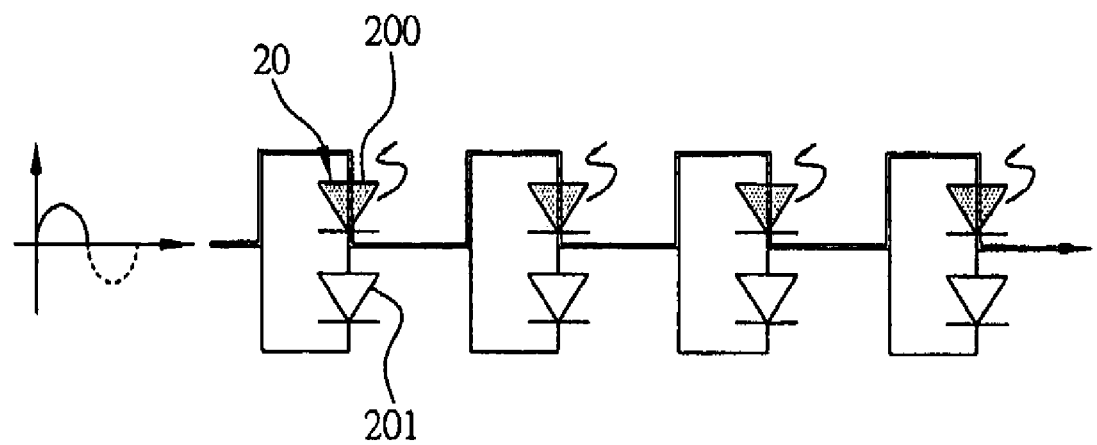
FIGS. 3A and 3B show the respective circuitry of FIGS. 2A and 2B illustrating the operation of a preferred embodiment of the alternating current light-emitting device according to the present invention.
Figure 3B:
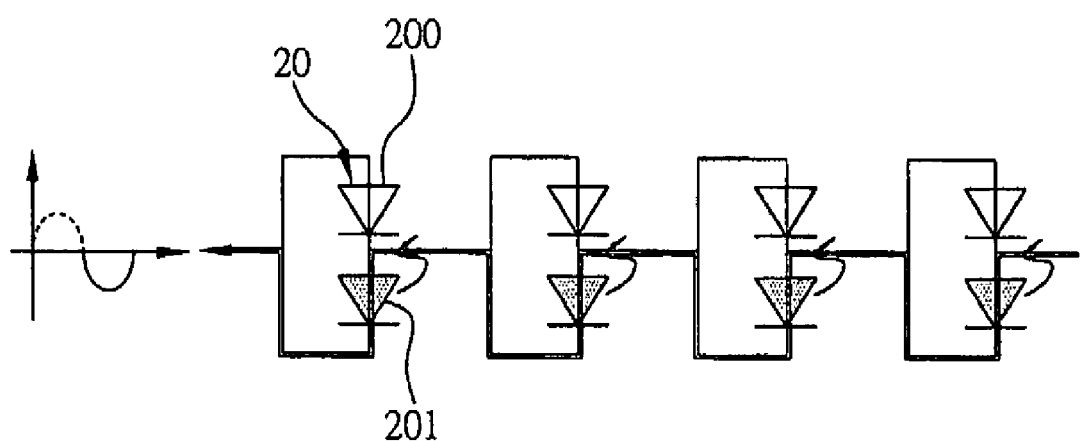

The alternating current light-emitting device of the present invention operates, using two light-emitting units, and is described in the following preferred embodiments with reference to FIGS. 2A and 2B and FIGS. 3A and 3B. FIGS. 2A and 2B show the way of applying alternating current to the alternating current light-emitting device. FIGS. 3A and 3B are equivalent circuitry of the alternating current light-emitting device, each corresponding to FIGS. 2A and 2B respectively, wherein each active layer, which comprises an upper active layer 200 and a lower active layer 201, Is equivalent to a light-emitting diode (LED) having a P/N structure, thereby forming a series connection between the upper active layer 200 and the lower active layer 201 of each micro-die 20, and the micro-dies 20 are electrically connected to one another in parallel by the conductive structure 3 as shown in FIGS. 3A and 3B.

FIGS. 2A and 3A show how light emission occurs during positive half cycles whenever alternating current flows through the alternating current light-emitting device. Upon input of positive half-cycle alternating current, the upper active layers 200 of the micro-dies 20 are forward biased, and the positive half-cycle alternating current is indicated by an arrow shown in FIG. 3A; as a result, light is emitted by the upper active layers 200 of the micro-dies 20. Upon input of negative half-cycle alternating current, the lower active layers 201 of the micro-dies 20 are forward biased, and the negative half-cycle alternating current is indicated by an arrow shown in FIG. 3B; as a result, light is emitted by the lower active layers 201 of the micro-dies 20. In other words, as illustrated by the equivalent circuitry, the present invention is implemented, using two stacked light-emitting diodes for receiving positive/negative half-cycle alternating current, thereby enabling the alternating current light-emitting device of the present invention to emit light during both positive half cycles and negative half cycles, and also enabling identical active layers of the micro-dies 20 (the upper active layers 200 or the lower active layers 201) to take turns to emit light during positive and negative half cycles of alternating current.

Figure 4:
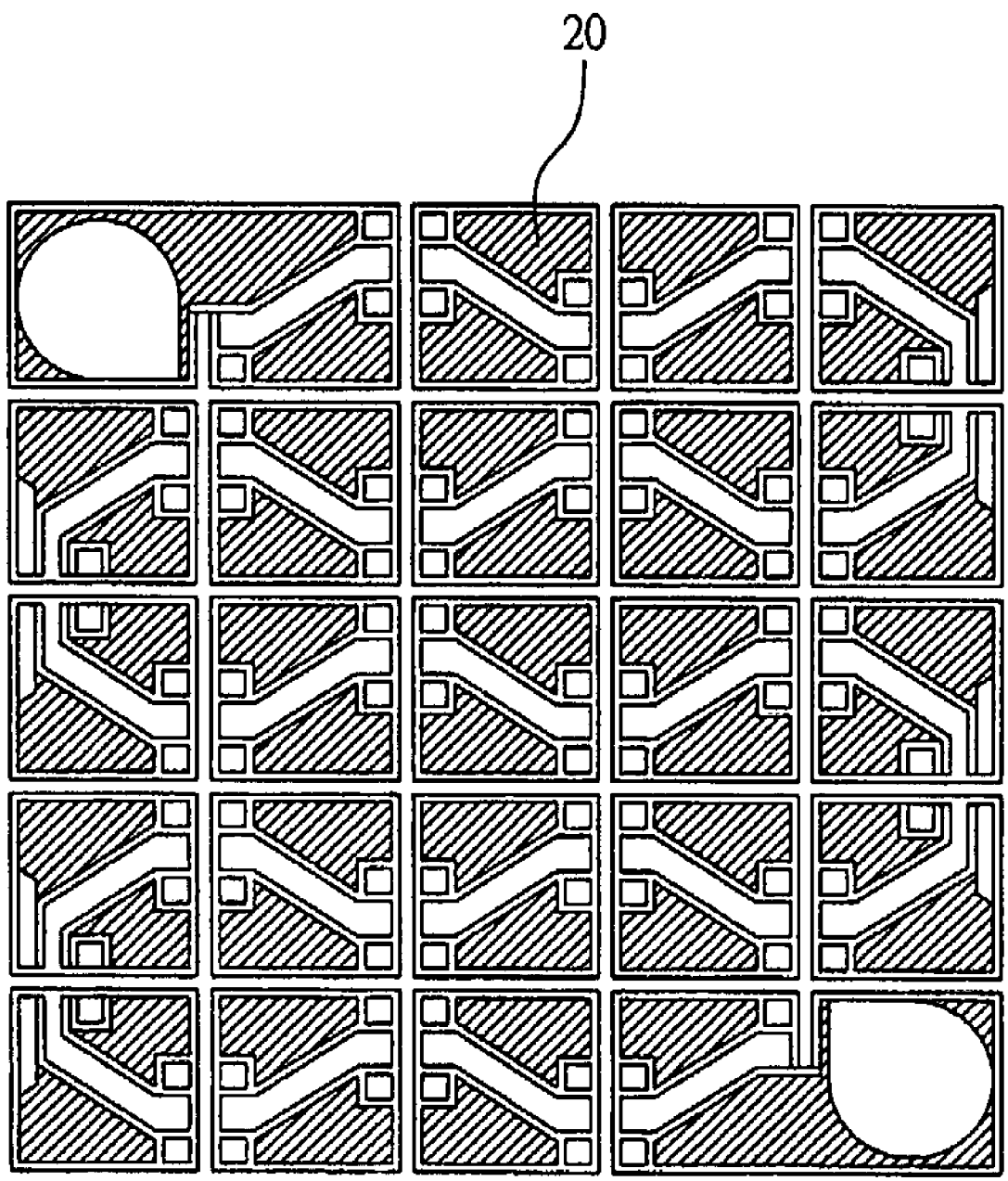
FIG. 4 is a top plan view showing an embodiment of a plurality of alternating current light-emitting devices disposed on a chip according to the present invention.

As shown in FIG. 4, where a plurality of alternating current light-emitting devices of the present invention interlacing one another are disposed on a chip and applied with alternating current, the light-emitting surface of the chip can take turns to emit light at a frequency, say, 60 Hz, and the micro-dies can emit light at identical or different wavelengths and thereby emit light of identical or different colors (the light being produced in the active layers). If different wavelength characteristics are selected for the micro-die 20 such that, for example, the upper active layer emits green light, whereas the lower active layer emits red light, then alternating light emission of the upper active layer and the lower active layer can result in light mixing (red light plus green light). More specifically, if green light having a wavelength which ranges between 485 and 500 nm (for the upper active layer) is used together with red light having a wavelength of 580 to 620 nm (for the lower active layer), the alternate, twinkling light rays emitted by the upper active layer and the lower active layer are mixed to form white light overlapped with black body radiant curves. Accordingly, the present invention not only provides an improved light-emitting device for all-time light emission, but also provides a device that emits light of automatically-adjusted colors (for example, monochromatic light or colored light) according to user needs, thereby eliminating the necessity of using fluorescent powder to produce white light. Therefore, the present invention offers advantages over the prior art.

Figure 5A:
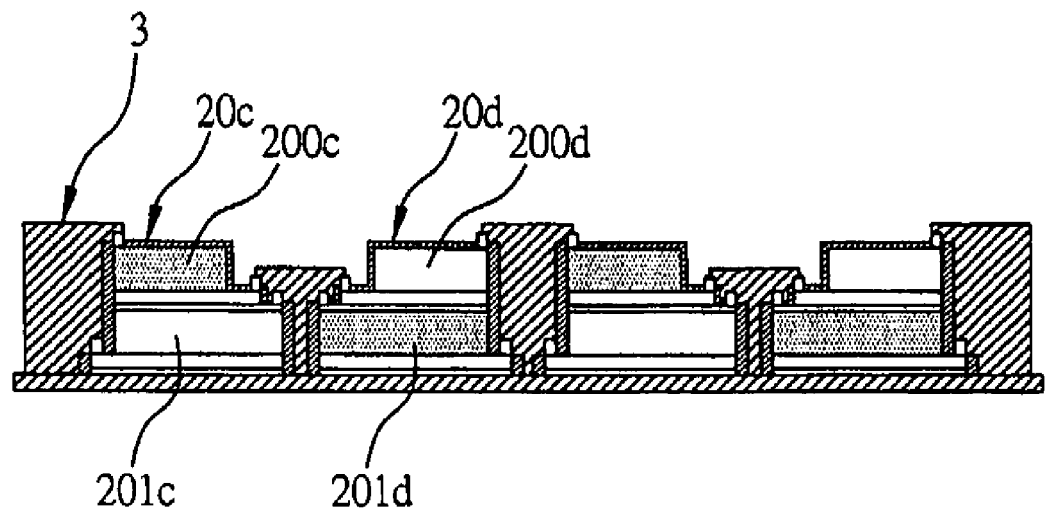
FIGS. 5A and 5B are schematic views showing the operation of the alternating current light-emitting device of another preferred embodiment according to the present invention.
Figure 5B:
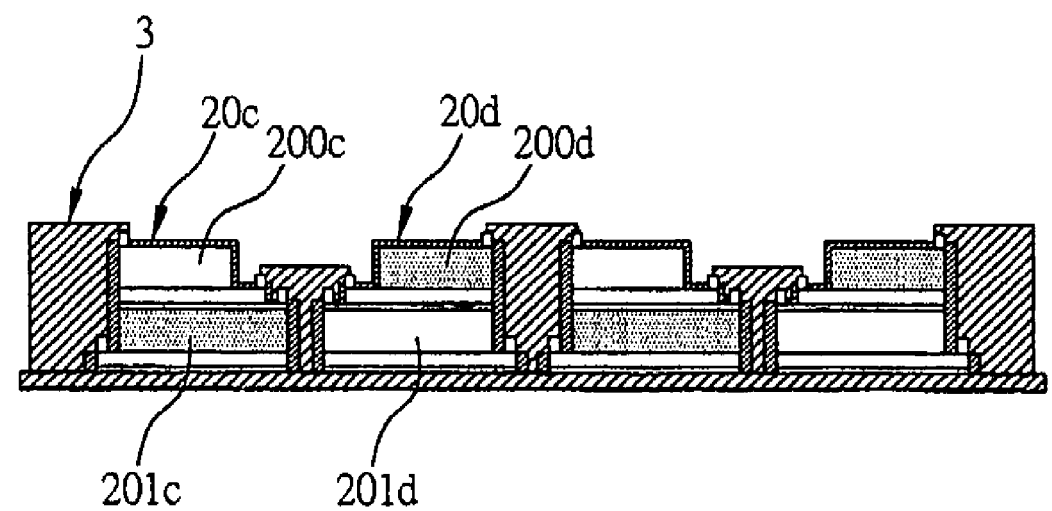
Figure 6A:
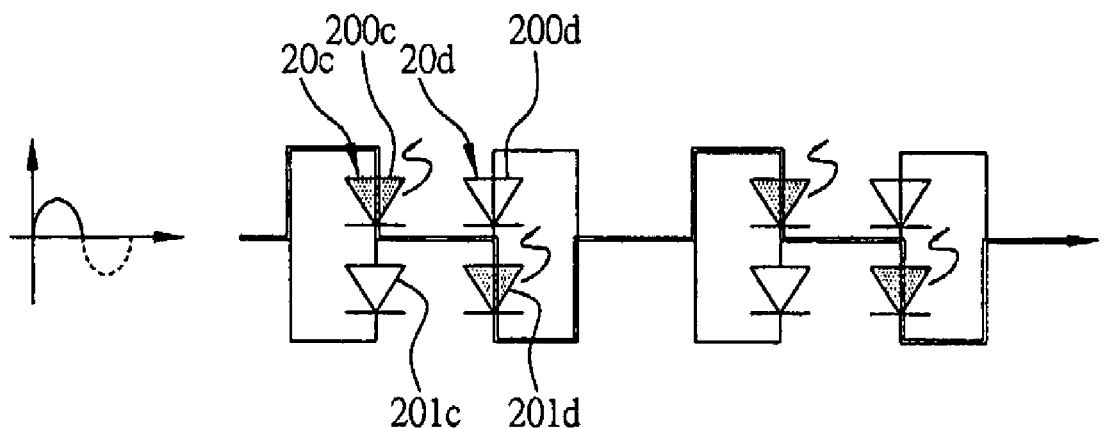
FIGS. 6A and 6B show the respective circuitry of FIGS. 5A and 5B illustrating the operation of another preferred embodiment of the AC light-emitting device according to the present invention.
Figure 6B:
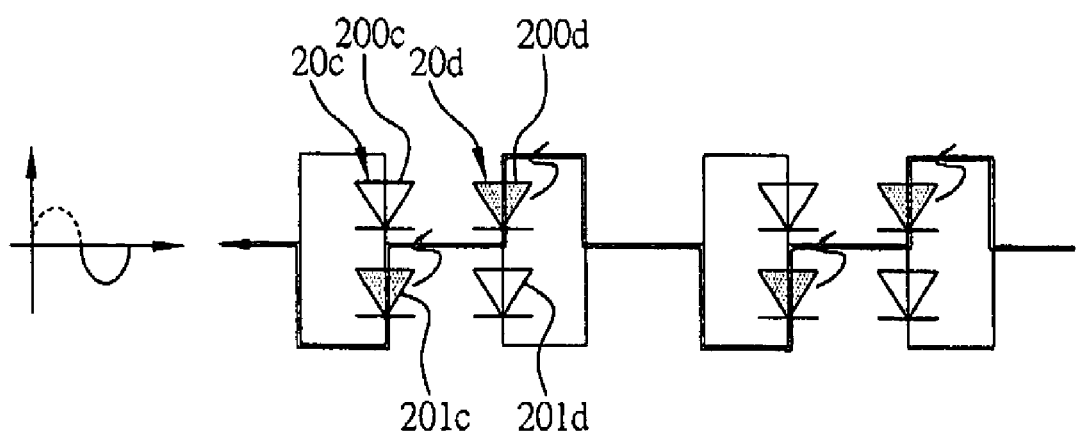

FIGS. 5A and 5B illustrate another embodiment of the alternating current light-emitting device of the present invention and the equivalent circuitry thereof shown in FIGS. 6A and 6B, wherein the active layers (comprising the upper active layers 200c and 200d and the lower active layers 201c and 201d) are collectively equivalent to a light-emitting diode having a P/N structure (wherein the upper active layers 200c and 200d are of a p structure, and the lower active layers 201c and 201d are of a n structure), thus the upper active layers 200c and 200d and the lower active layers 201c and 201d of the micro-dies 20c and 20d are connected in series, while the micro-dies 20c and 20d are connected in parallel by the conductive structure 3.

FIG. 5A and FIG. 6A each illustrates how the alternating current light-emitting device emits light during positive half cycles of alternating current. During the positive half cycles of alternating current, different active layers of the adjacent micro-dies 20c and 20d are forward biased (namely, the upper active layer 200c of the micro-die 20c, and the lower active layer 201d of the micro-die 20d). During the positive half cycles of alternating current indicated by an arrow in FIG. 6A, light is emitted by different active layers of the micro-dies 20c and 20d. Similarly, during the negative half cycles of alternating current as shown in FIG. 5B and FIG. 6B, different active layers of the adjacent micro-dies 20c and 20d are forward biased (namely, the upper active layer 200d of the micro-die 20d, and the lower active layer 201c of the micro-die 20c). During the negative half cycles of alternating current indicated by an arrow in FIG. 6B, light is emitted by different active layers of the micro-dies 20c and 20d. In other words, as it can be seen from the equivalent circuitry, the preferred embodiment is implemented using two stacked, identical light-emitting diodes for receiving positive/negative half-cycle alternating current, such that the alternating current light-emitting device of the present invention can emit light during both positive half cycles and negative half cycles. It differs from the embodiments depicted in FIGS. 2A, 2B, 3A and 3B in that the different active layers of the micro-dies 20c and 20d take turns to emit light during the positive and negative half cycles of alternating current. However, all-time light emission may also take place on a light-emitting surface of a chip, provided that a plurality of alternating current light-emitting devices of the present invention are disposed on the chip in an interlaced manner and configured to receive alternating current.

Similarly, the micro-dies 20c and 20d as described above can emit light at identical or different wavelengths (the related active layers can also emit light at identical or different wavelengths) in order to emit light of identical or different colors. Where the micro-dies 20c and 20d emit light at different wavelengths (for instance, the upper active layers 200c and 200d emit green light, and the lower active layers 201c and 201d emit red light), the alternating of the light emission from different active layers (from the upper active layer 200c to the lower active layer 201d, or from the upper active layer 200d to the lower active layer 201c) can achieve the effect of mixing colored light (such as red light plus green light, the embodiment thereof is the same as the foregoing embodiment and thus it is not further discussed herein). In addition, depending on fabrication, the upper active layers 200c and 200d and the lower active layers 201c and 201d are capable of emitting light of different colors at a pulsating, light emission frequency of 120 Hz (60 Hz×2) that practically exceeds the maximum frequency 100 Hz recognizable by human vision, contributing to the visual effect of mixing light more evenly or softly to provide for an optimal visual effect. Accordingly, the continuous light-emitting device described in this embodiment not only meets users' needs to flexibly allocate colors of emitting light but also produces more even and soft light for optimal visual effects.

Figure 7:
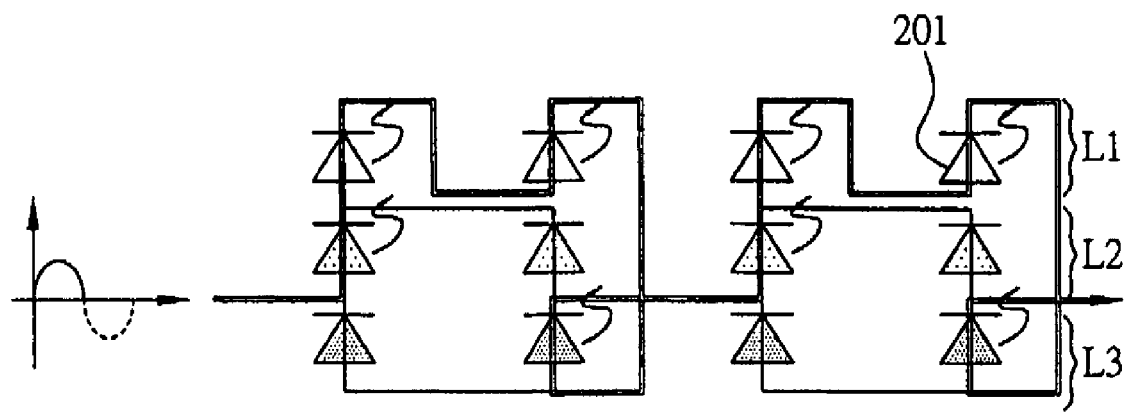
FIG. 7 is a three-layer equivalent circuitry showing a plurality of alternating current light-emitting devices of the present invention.

In the case that the alternating current light-emitting device of the present invention is a structure having three active layers—a preferred embodiment shown in FIG. 7 illustrates an equivalent circuitry adding one active layer as described above and one equivalent light-emitting diode—more colors are possible. When inputting the positive half-cycle of alternating current as shown by an arrow, each active layer conducting the positive half-cycle of current will emit light (the current passing route of the negative half cycles of alternating current can be easily discerned from the positive half cycles of alternating current and thus is not further described herein). A preferred embodiment of this three-layer structure is implemented by having a first layer L1 to emit green light that is the most important color for producing white light due to the way the human eye poorly responds to green wavelengths, having a second layer L2 to emit blue light that is the second most important color for producing white light, and having a third layer L3 to emit red light that is the third most important color for generating white light. Based on FIG. 7, the colors produced during the positive half cycle of alternating current appear in the order (following the arrow from left to right) of blue, green, green, red, blue, green, green, red. The colors produced during the negative half cycle of alternating current also appear in the same order of blue, green, green, red, blue, green, green, red, but this time current flows from right to left to utilize the two blue and two red diodes that didn't conduct during the positive half-cycle (all of the green diodes emit light during the negative half-cycle just as during the positive half-cycle since, as mentioned, the human eye needs more green mixed in order to perceive white). Therefore, the alternating current light-emitting device of the present invention can employ and match different colors to achieve an overall desired color effect when the positive or negative half cycles of alternating current are applied to the active layers thereof. Also, in order for this three-layer structure to have the effect of producing white light (by mixing colors of emitted light), a preferred embodiment involves mixing green light at a 535 nm wavelength with blue light at a 460 nm wavelength and red light at a 630 nm wavelength. It should be added that when three or more active layers are used to mix light, adjustments in color temperature are required, for example, one or more active layers can be made nonluminous by applying short circuits to meet the light mixing requirements in practical use.

Figure 8:
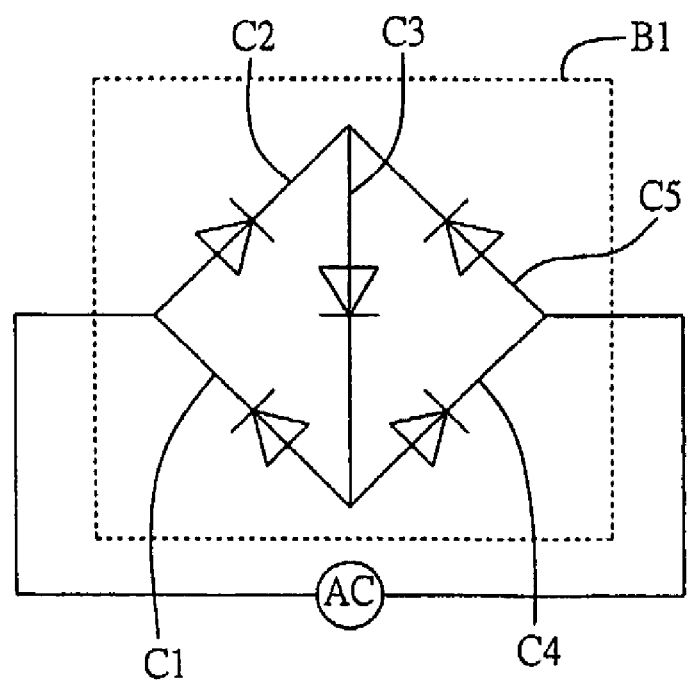
FIG. 8 is a basic circuitry showing the micro-dies of the plurality of alternating current light-emitting devices of the present invention having at least one active layer with the micro-dies disposed according to a pattern of a diode circuit in a bridge rectifier.

Furthermore, as shown in FIG. 8, the one or more active layers of the micro-dies disclosed in the present invention may be disposed in accordance with a pattern of a diode circuit in a bridge rectifier, wherein the active layers are electrically connected to one another (as described above, an active layer is equivalent to a light-emitting diode). The embodiment for attaining an optimal light mixing effect involves mixing colors by two or three active layers (wherein the preferred embodiment of using two or three active layers to mix light colors is the same as the one described above and thus a related description is omitted herein).

Figure 9A:
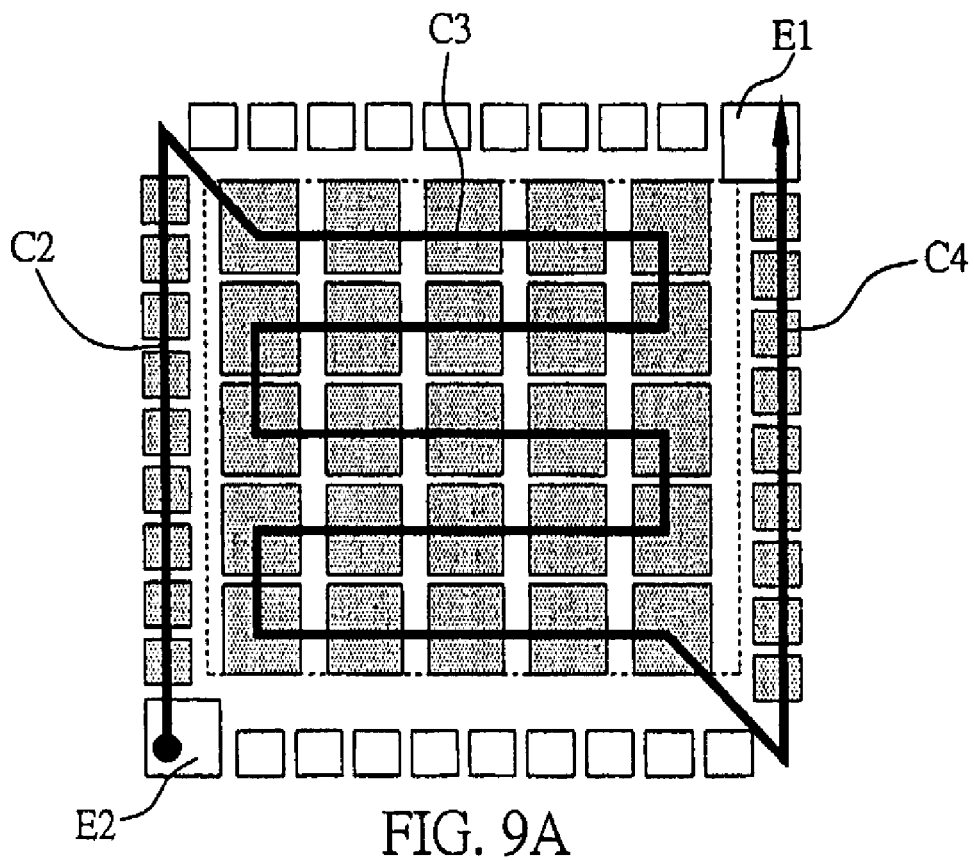
FIGS. 9A and 9B are, respectively, schematic diagrams showing an embodiment of positive and negative half cycles of alternating current applied to a chip according to the circuit configuration of the preferred embodiment depicted in FIG. 8.
Figure 9B:
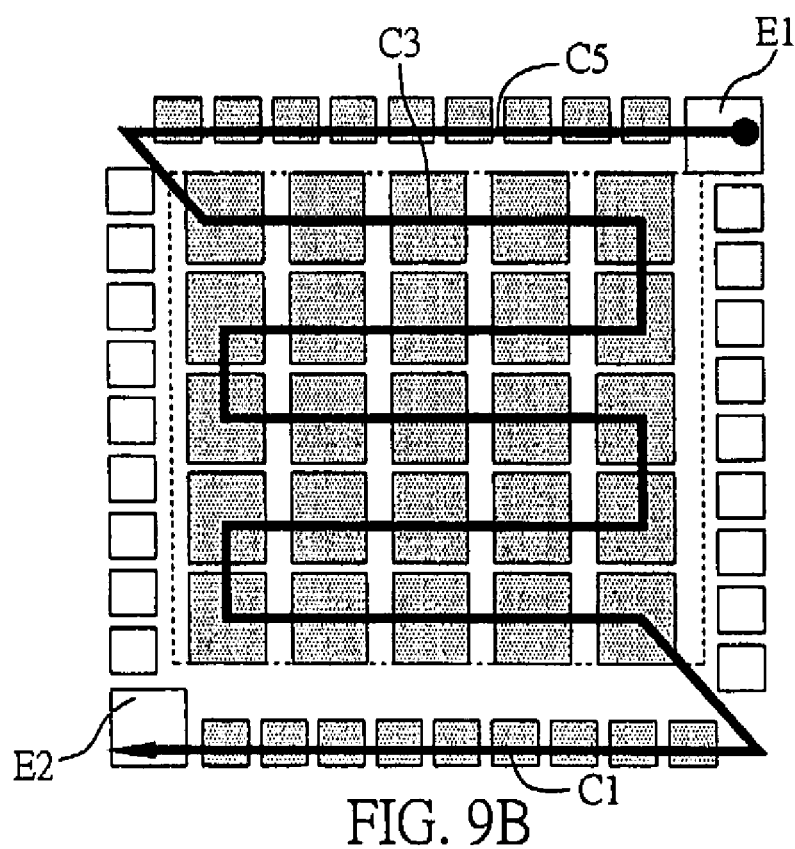

Also, as illustrated in FIG. 8, each of the electrically connected circuits disposed in accordance with the foregoing circuit structure is defined as a first circuit C1, a second circuit C2, a third circuit C3, a fourth circuit C4 and a fifth circuit C5 for illustration purposes, wherein the light emission colors and the number of the active layers (equivalent to light-emitting diodes) can be decided by the users depending on the requirements. A preferred embodiment is to respectively dispose 10 active layers having one or more layers on the first circuit C1, the second circuit C2, the fourth circuit C4, and the fifth circuit C5, and disposing 22 active layers on the third circuit C3 having one or more active layers. With a circuit structure disposed in the aforesaid manner, the number of active layers subjected to alternating current reverse bias is approximately half of the number of the active layers subjected to alternating current forward bias. Hence, if this structure uses a plurality of active layers to concurrently take the reverse bias of alternating current, the reverse bias alternating current will be evenly shared among the active layers (one active layer can take about 10-15 volts of reverse bias) so as to prevent a short circuit that may otherwise occur because the active layers undergo a "breakdown" induced by excessive reverse bias. Also, the foregoing embodiment can be implemented to achieve the effect of mixing colors to produce white light. The drawing showing this embodiment is characterized in that, in addition to the fact that light-emitting diodes differing colors may be used and that the number of the active layers can be flexibly decided, the configuration of the second circuit C2, the third circuit C3 and the fourth circuit C4 as shown in FIG. 9A conducting the positive half cycles of alternating current, and the configuration of the fifth circuit C5, the third circuit C3 and the first circuit C1 conducting the negative half cycles of alternating current as shown in FIG. 9B, are employed to dispose the third circuit to conduct both the positive and negative half cycles of alternating current on the light-emitting surface of a chip, thereby achieving the effect of continuous light emission when the conductive electrodes E1 and E2 on the major light-emitting area of the chip surface are connected with alternating current (said conductive electrode E1 and E2 are electrically connected to the circuit). As the plurality of active layers having one or more layers of the third circuit C3 can emit light during either the positive or negative half cycles of alternating current, the number of active layers used according to the prior art can be reduced. For example, the number of active layers used according to the prior art requires 22 layers for each of the positive and the negative half cycles of alternating current, which together totals 44, while, according to the present invention, only a total number of 22 active layers are required to achieve all-time light emission.

Figure 10A:
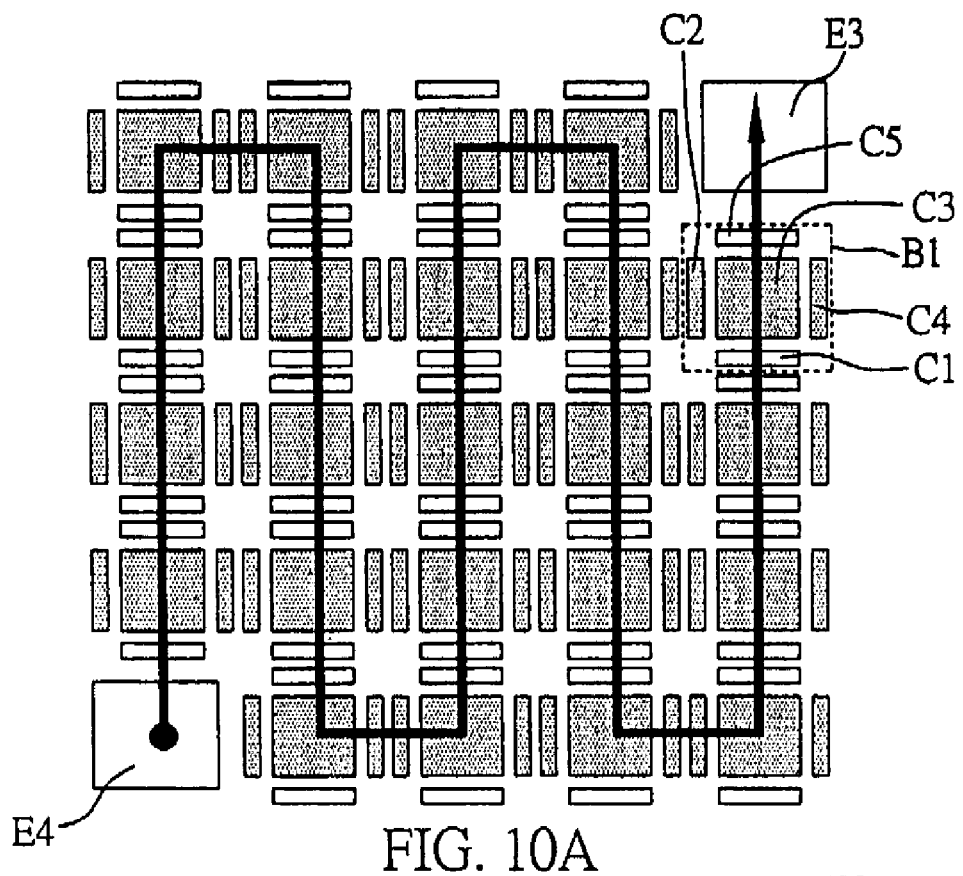
FIGS. 10A and 10B are, respectively, schematic diagrams showing an embodiment of positive and negative half cycles of alternating current applied to a chip and implemented by a plurality of bridge light-emitting units, using the circuit configuration of the preferred embodiment depicted in FIG. 8, wherein the circuit configuration of the preferred embodiment depicted in FIG. 8 is treated as one bridge light-emitting unit.
Figure 10B:
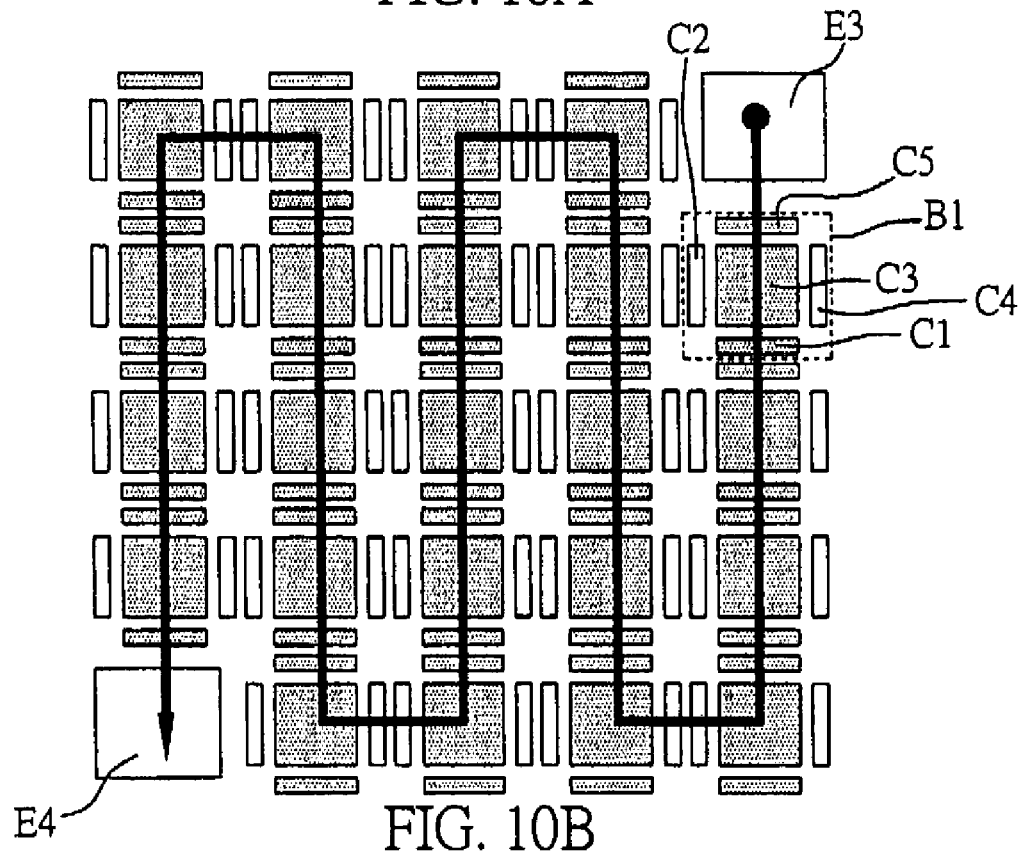

Furthermore, the circuit configuration of the foregoing active layers (equivalent to LEDs) can also be a bridge light-emitting unit B1 as shown in FIG. 8, that is, a bridge light-emitting unit B1 is a micro-die having one or more active layers and the circuit configuration thereof is arranged as per the diodes in a bridge rectifier to electrically connect to one another. A plurality of bridge light-emitting units B1 disposed in a matrix-like pattern as shown in FIGS. 10A and 10B are disposed on the light-emitting surface of a chip (preferably the number of the bridge light-emitting units B1 in the central region is larger than that in the peripheral region), and the two opposite diagonal corners of the matrix-like pattern are disposed with two conductive electrodes E3 and E4 for connection with an alternating current source (the two conductive electrodes E3 and E4 are connected to the bridge light-emitting unit B1 in series), such that when connected to the alternating current source, the current of the positive or negative half cycles passes through most parts of the light-emitting surface of the chip to emit light continuously.

The circuit configuration as described above can also be applied to an alternating current light-emitting device composed of micro-dies having a single active layer, for example, forming on a substrate a bridge light-emitting unit composed of a plurality of alternating current light-emitting diode micro-dies. The micro-dies are disposed in accordance with a pattern of a diode circuit in a bridge rectifier and are electrically connected to one another by a conductive structure, and in consequence the micro-dies take turns to emit light during the positive and negative half cycles of alternating current. Alternatively, the above-mentioned can include a plurality of bridge light-emitting units electrically connected to one another and disposed in a matrix-like pattern, and the number of the all-time light-emitting micro-dies disposed in the central region is larger than the number of rectified light-emitting micro-dies disposed in the peripheral region, so as to achieve a full-scale light-emitting area for even light emission. In addition, the above-mentioned further includes conductive electrodes disposed at the two opposite diagonal corners of the matrix-like pattern, and the conductive electrodes are connected to the bridge light-emitting units in series for connection with an alternating current source. Since the circuit structure thereof is similar to that described above, thus it is not further described herein.

The active layers (equivalent to LEDs as mentioned above) disclosed by the present invention can be directly applied to the related circuits or indicator circuits without any external load. Accordingly, in the present invention, a plurality of active layers may be connected to one another in parallel, or groups of the active layers disposed by parallel connections may be connected in series, so as to form lighting devices for different purposes. Moreover, the active layers can be applied to LCD backlight devices as disclosed by US Patent No. 2005001537, US Patent No. 2004246696, and Japanese Patent No. 2004333583. The active layers can also be implemented by a variety of manufacturing processes, such as a 5ΦLED conducting wire stand glue-irrigating packaging process, a super flux conducting wire stand glue-irrigating packaging process; a flip-chip process, a ceramics substrate process, an aluminum substrate process, PPA point-gluing, an injection packaging process, or a To metal shell packaging process, and so forth.

Figure 11A:
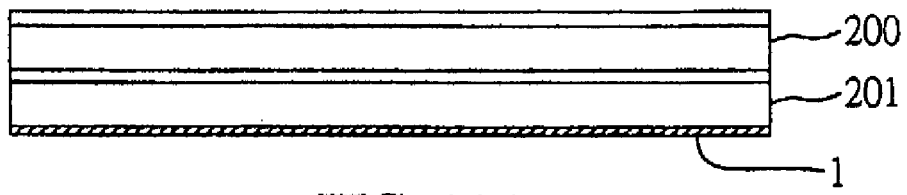
FIGS. 11A through 11E are structural flowcharts showing collectively a fabrication method of the alternating current light-emitting devices of the present invention.
Figure 11B:
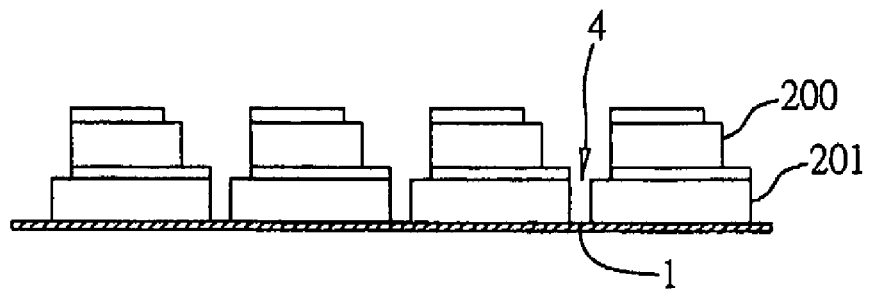
Figure 11C:
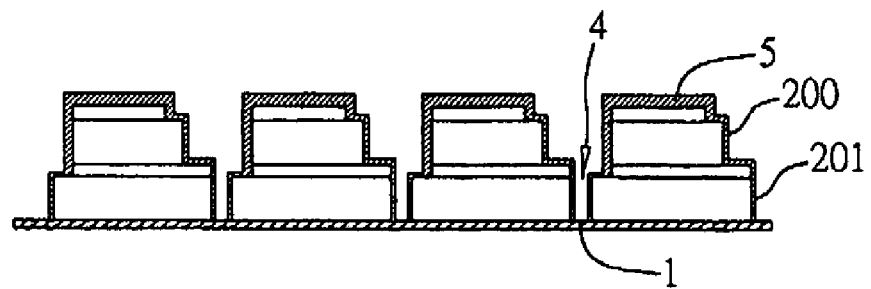
Figure 11D:
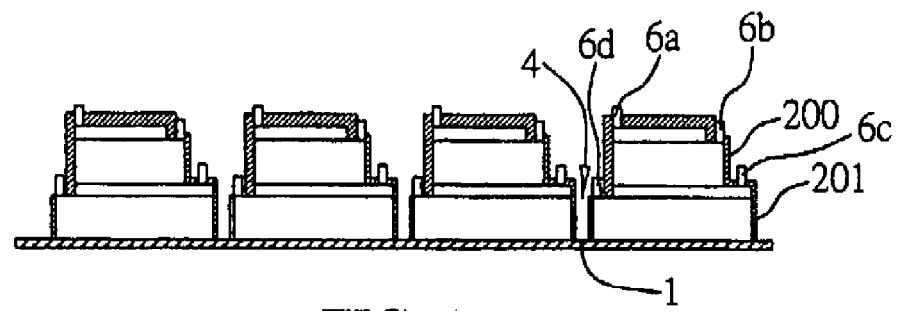
Figure 11E:
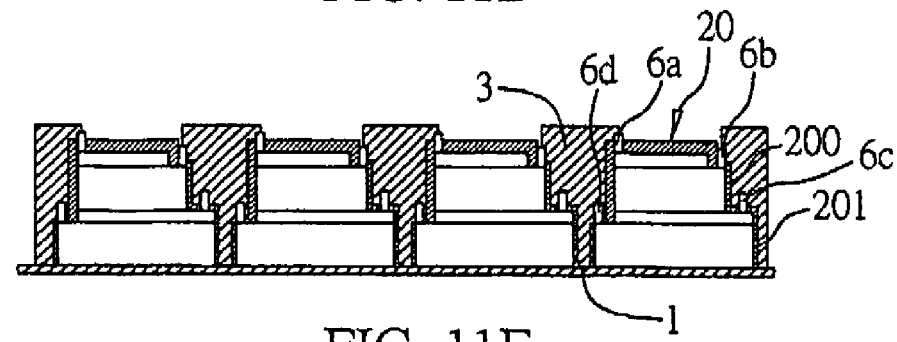

The present invention further provides a fabrication method for the alternating current light-emitting device as shown in FIGS. 11A through 11E. To correspond with the aforementioned embodiments, the fabrication method thereof is exemplified by the drawing depicting two alternating current light-emitting devices. Referring to FIG. 11A, the fabrication method comprises the steps of: providing a substrate 1 and forming at least two active layers on the substrate in a chip-stacking manner (the upper active layer 200 and the lower active layer 201 as shown in the drawing), wherein the active layers comprise a p-type light-emitting layer and a n-type light-emitting layer collectively equivalent to the light-emitting diode P/N structure. The p-type light-emitting layer and the n-type light-emitting layer are preferably implemented using P-InGaN and N-InGaN respectively. Subsequently, as shown in FIG. 11B, a plurality of openings 4 are formed in the active layers (the upper active layer 200 and the lower active layer 201) by lithography and etching so as to expose a portion of the substrate 1 through the openings 4. Then, as shown in FIG. 11C, a periphery of the active layers (the upper active layer 200 and the lower active layer 201) is covered with a protection layer 5 for preventing leakage of current. The protection layer 5 is made of a dielectric material, such as $SiO_x$, $SiN_x$, and so forth. Following that, as shown in FIG. 11D, a plurality of conductive terminals 6a, 6b, 6c, and 6d are formed through the protection layer 5 so as to electrically connect to the active layers (the upper active layer 200 and the lower active layer 201). Lastly, as shown in FIG. 11E, a plurality of conductive structures 3 are formed on the openings 4 to electrically connect to the active layers (the upper active layer 200 and the lower active layer 201) so as to enable them to take turns to emit light during the position or negative half cycles of alternating current. As the application of substrate 1, the active layers (the upper active layer 200 and the lower active layer 201), and the conductive structures 3 mentioned in the fabrication method are the same as those shown in FIGS. 2A, 2B, 3A, and 3B, therefore the description thereof is omitted herein.

The plurality of conductive terminals 6a, 6b, 6c, and 6d are formed by vapor deposition and can be implemented using an ohmic electrode electrically connected to the active layers (the upper active layer 200 and the lower active layer 201) to form the micro-die 20, which can be implemented by emitting light at identical or different wavelengths as mentioned above.

Figure 12A:
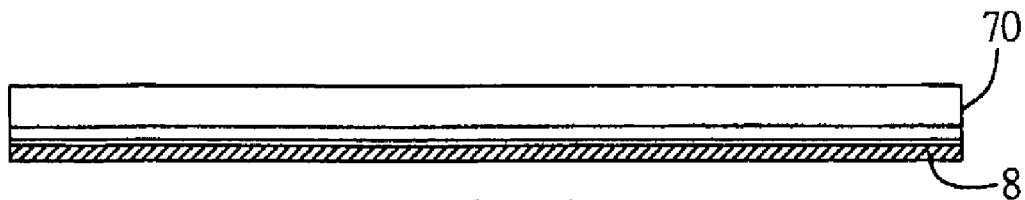
FIGS. 12A through 12F are structural flowcharts showing collectively another embodiment of a fabrication method of the alternating current light-emitting devices of the present invention.
Figure 12B:
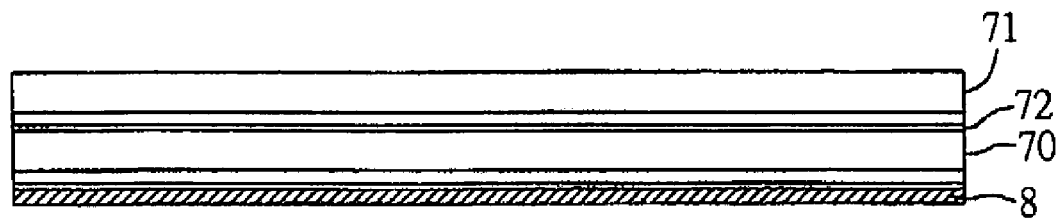
Figure 12C:
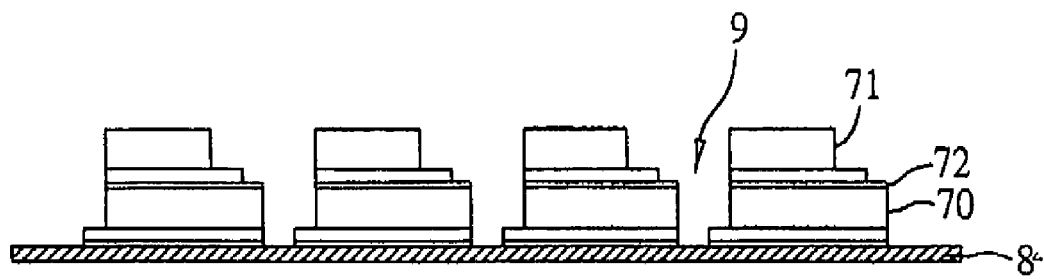
Figure 12D:
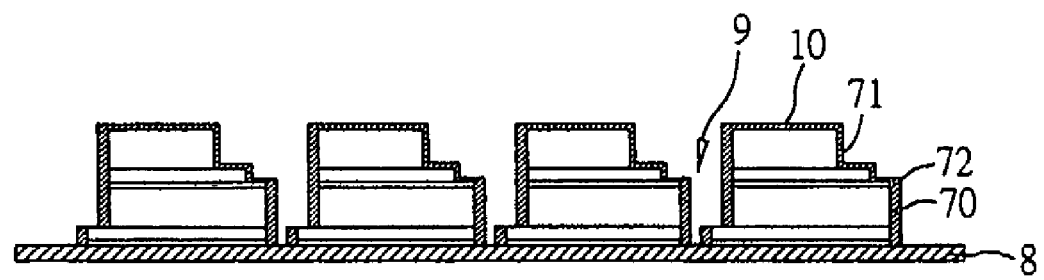
Figure 12E:
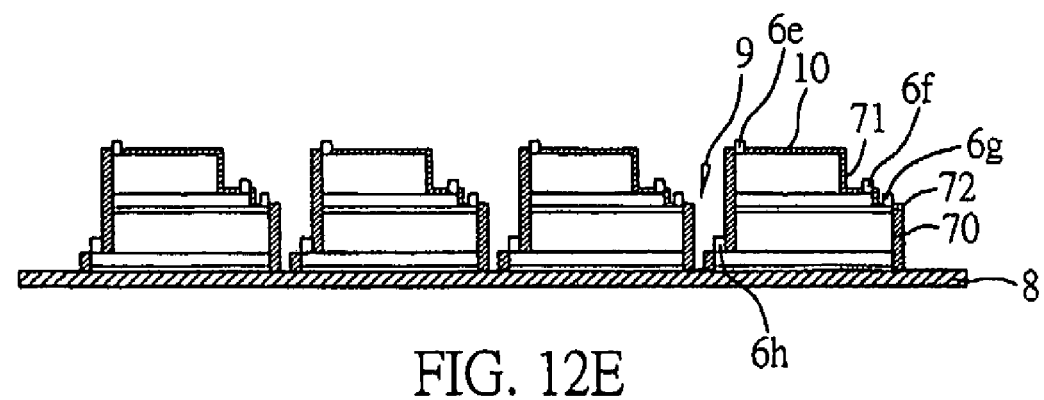
Figure 12F:
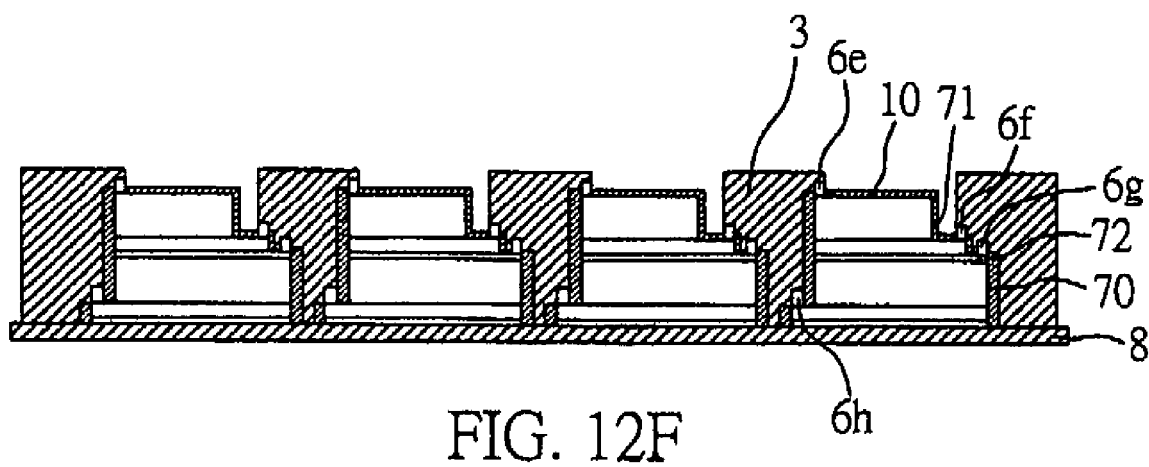

Accordingly, FIGS. 12A through 12F illustrate a fabrication method of the alternating current light-emitting device of the present invention using two alternating current light-emitting devices in accordance with the aforementioned embodiments. The method comprises the steps of: providing a first substrate (not shown), forming a first active layer 70 on the first substrate, and removing the first substrate; disposing the first active layer 70 on a second substrate 8, as shown in FIG. 12A; forming a second active layer 71 on the first active layer 70, and forming a connection layer 72 between the first active layer 70 and the second active layer 71, as shown in FIG. 12B, wherein the connection layer 72 is made of conductive and non-conductor materials and is previous to light; forming a plurality of openings 9 in the first active layer 70 and the second active layer 71 by lithography and etching so as to expose a portion of the second substrate 8 through the openings, as shown in FIG. 12C; then, referring to FIG. 12D, a protective layer 10 is disposed on a periphery of the first active layer 70 and the second active layer 71 to prevent leakage of electric current; the protective layer 10 is made of a dielectric material, such as $SiO_x$, $SiN_x$, and so on; then, further referring to FIG. 12E, a plurality of conductive terminals 6e, 6f, 6g, and 6h are formed through the protective layer 10 to electrically connect to the first active layer 70 and the second active layer 71; lastly, referring to FIG. 12F, a plurality of conductive structures 3 are formed on the openings 9 to electrically connect to the first active layer 70 and the second active layer 71 so as to enable the structures to take turns to emit light during the positive and negative half cycles of alternating current. As the second substrate 8, the active layers (the first active layer 70 and the second active layer 71) and the conductive structures 3 are substantially similar to those embodiments described in FIGS. 2A, 2B, 3A, and 3B in terms of structure, thus they are not herein described further.

Similarly, the plurality of conductive terminals 6e, 6f, 6g, and 6h of the present fabrication method are also formed by vapor deposition and are implemented in the form of ohmic electrodes; the conductive terminals are electrically connected to the active layers (the first active layer 70 and the second active layer 71) to form the micro-die 20 that emits light at identical or different wavelengths.

To sum up, the alternating current light-emitting device disclosed by the present invention is characterized in that each micro-die formed comprises at least two active layers (preferably two or three layers), such that the active layers of the micro-dies can take turns to emit light during the positive and negative half cycles of alternating current, thereby providing a full-scale light-emitting area for all-time light emission. Furthermore, the fundamental structure of the active layers disclosed by the present invention can be applied to different circuit configurations to achieve the optimal effect of mixing light and all-time light emission as required.

The descriptions below of specific embodiments are to illustrate the present invention. Others skilled in the art can easily understand other advantages and features of the present invention from contents disclosed in this specification. The present invention can be carried out or applied through different embodiments. Every details of this specification can be modified based on different viewpoints and applications yet still within the scope of the present invention.

What is claimed is:

1. A fabrication method for an alternating current light-emitting device, the fabrication method comprising the steps of:
    providing a substrate;
    forming at least two active layers on the substrate;
    forming a plurality of openings in the active layers such that a portion of the substrate is exposed through the openings;
    covering a periphery of the active layers with a protective layer;
    forming a plurality of conductive terminals through the protection layer so as to electrically connect to the active layers; and
    forming a plurality of conductive structures on the exposed portions of the substrate in the openings, the conductive structures providing electrical connection with the active layers such that, after alternating current is applied to the active layers, the active layers take turns to emit light during positive and negative half cycles of alternating current.

2. The fabrication method of the alternating current light-emitting device of claim 1, wherein the substrate is a chip.

3. The fabrication method of the alternating current light-emitting device of claim 1, wherein the substrate is an insulating substrate.

4. The fabrication method of the alternating current light-emitting device of claim 1, wherein the active layer is a luminescent active layer.

5. The fabrication method of the alternating current light-emitting device of claim 1, wherein the conductive structure comprise a conductor connecting the active layers flanking each of the openings.

6. The fabrication method of the alternating current light-emitting device of claim 5, wherein the conductor is a conductive bridge.

7. The fabrication method of the alternating current light-emitting device of claim 1, wherein the conductive terminals and the active layers are electrically connected so as to form a micro-die thereafter.

8. The fabrication method of the alternating current light-emitting device of claim 7, wherein the micro-dies emit light at identical wavelengths.

9. The fabrication method of the alternating current light-emitting device of claim 7, wherein the micro-dies emit light at different wavelengths.

10. The fabrication method of the alternating current light-emitting device of claim 7, wherein the active layers of the micro-dies emit light at identical wavelengths.

11. The fabrication method of the alternating current light-emitting device of claim 7, wherein the active layers of the micro-dies emit light at different wavelengths.

12. The fabrication method of the alternating current light-emitting device of claim 7, wherein the active layers of the micro-dies emit light at identical wavelengths and take turns to emit light during the positive and negative half cycles of alternating current.

13. The fabrication method of the alternating current light-emitting device of claim 7, wherein the active layers of the micro-dies emit light at different wavelengths and take turns to emit light during the positive and negative half cycles of alternating current.

14. The fabrication method of the alternating current light-emitting device of claim 1, wherein the conductive terminals are formed by vapor deposition.

15. The fabrication method of the alternating current light-emitting device of claim 1, wherein the conductive terminals are ohmic electrodes.

16. The fabrication method of the alternating current light-emitting device of claim 1, wherein the at least two active layers on the substrate are formed in sequence by epitaxy technology.

17. The fabrication method of the alternating current light-emitting device of claim 1, wherein the plurality of openings are formed in the active layers by lithography and etching.

18. The fabrication method of the alternating current light-emitting device of claim 1, wherein the protective layer is made of a dielectric material.

19. The fabrication method of the alternating current light-emitting device of claim 18, wherein the dielectric material is one of $SiO_x$ and $SiN_x$.

20. A fabrication method for an alternating current light-emitting device, the fabrication method comprising the steps of:
   providing a first substrate;
   forming a first active layer on the first substrate;
   removing the first substrate, and disposing the first active layer on a second substrate;
   forming a second active layer on the first active layer, and forming a connection layer between the first active layer and the second active layer;
   forming a plurality of openings in the first active layer and the second active layer such that a portion of the second substrate is exposed through the openings;
   covering a periphery of the first active layer and the second active layer with a protective layer;
   forming a plurality of conductive terminals through the protective layer to electrically connect to the first active layer and the second active layer; and
   forming on the openings a plurality of conductive structures for electrical connection with the first active layer and the second active layer such that, after alternating current is applied to the first active layer and the second active layer, the first active layer and the second active layer take turns to emit light during positive and negative half cycles of alternating current.

21. The fabrication method of the alternating current light-emitting device of claim 20, wherein the first substrate is a chip.

22. The fabrication method of the alternating current light-emitting device of claim 20, wherein the first substrate is an insulating substrate.

23. The fabrication method of the alternating current light-emitting device of claim 20, wherein the second substrate is an insulating substrate.

24. The fabrication method of the alternating current light-emitting device of claim 20, wherein the first active layer is a luminescent active layer.

25. The fabrication method of the alternating current light-emitting device of claim 20, wherein the second active layer is a luminescent active layer.

26. The fabrication method of the alternating current light-emitting device of claim 20, wherein the conductive structures comprise a conductor connecting the first active layer and the second active layer flanking each of the openings.

27. The fabrication method of the alternating current light-emitting device of claim 26, wherein the conductor is a conductive bridge.

28. The fabrication method of the alternating current light-emitting device of claim 20, wherein the conductive terminals, the first active layer, and the second active layer are electrically connected to one another so as to form a micro-die thereafter.

29. The fabrication method of the alternating current light-emitting device of claim 28, wherein the micro-dies emit light at identical wavelengths.

30. The fabrication method of the alternating current light-emitting device of claim 28, wherein the micro-dies emit light at different wavelengths.

31. The fabrication method of the alternating current light-emitting device of claim 28, wherein the first active layer and the second active layer of the micro-die emit light at identical wavelengths.

32. The fabrication method of the alternating current light-emitting device of claim 28, wherein the first active layer and the second active layer of the micro-die emit light at different wavelengths.

33. The fabrication method of the alternating current light-emitting device of claim 28, wherein the first active layer and the second active layer of the micro-dies take turns to emit light during the positive and negative half cycles of alternating current.

34. The fabrication method of the alternating current light-emitting device of claim 28, wherein the first active layer and the second active layer of adjacent micro-dies take turns to emit light during the positive and negative half cycles of alternating current.

35. The fabrication method of the alternating current light-emitting device of claim 20, wherein the conductive terminals are formed by vapor deposition.

36. The fabrication method of the alternating current light-emitting device of claim 20, wherein the conductive terminals are ohmic electrodes.

37. The fabrication method of the alternating current light-emitting device of claim 20, wherein the connection layer is made of a material selected from the group consisting of a conductive material and a non-conductive material.

38. The fabrication method of the alternating current light-emitting device of claim 37, wherein the connection layer is made of a material previous to light.

39. The fabrication method of the alternating current light-emitting device of claim 20, wherein the plurality of openings are formed in the first active layer and the second active layer by lithography and etching.

40. The fabrication method of the alternating current light-emitting device of claim 20, wherein the protective layer is made of a dielectric material.

41. The fabrication method of the alternating current light-emitting device of claim 40, wherein the dielectric material is one of $SiO_x$ and $SiN_x$.

42. A fabrication method for an alternating current light-emitting device, the fabrication method comprising the steps of:
   providing a substrate;
   forming at least two active layers on the substrate, the at least two active layers comprising a first active layer formed on the substrate and a second active layer formed on the first active layer;
   forming a plurality of openings in the active layers such that a portion of the substrate is exposed through the openings;
   covering a periphery of the active layers with a protective layer;
   forming a plurality of conductive terminals through the protection layer so as to electrically connect to the active layers; and
   forming on the exposed portions of the substrates in the openings a plurality of conductive structures for electrical connection with the active layers such that, after alternating current is applied to the active layers, the active layers take turns to emit light during positive and negative half cycles of alternating current.

43. The fabrication method of the alternating current light-emitting device of claim 42, wherein the substrate is a chip.

44. The fabrication method of the alternating current light-emitting device of claim 42, wherein the substrate is an insulating substrate.

45. The fabrication method of the alternating current light-emitting device of claim 42, wherein the active layer is a luminescent active layer.

46. The fabrication method of the alternating current light-emitting device of claim 42, wherein the conductive structures comprise a conductor connecting the active layers flanking each of the openings.

47. The fabrication method of the alternating current light-emitting device of claim 46, wherein the conductor is a conductive bridge.

48. The fabrication method of the alternating current light-emitting device of claim 42, wherein the conductive terminals and the active layers are electrically connected so as to form a micro-die thereafter.

49. The fabrication method of the alternating current light-emitting device of claim 48, wherein the micro-dies emit light at identical wavelengths.

50. The fabrication method of the alternating current light-emitting device of claim 48, wherein the micro-dies emit light at different wavelengths.

51. The fabrication method of the alternating current light-emitting device of claim 48, wherein the active layers of the micro-dies emit light at identical wavelengths.

52. The fabrication method of the alternating current light-emitting device of claim 48, wherein the active layers of the micro-dies emit light at different wavelengths.

53. The fabrication method of the alternating current light-emitting device of claim 48, wherein the active layers of the micro-dies emit light at identical wavelenghts and take turns to emit light during the positive and negative half cycles of alternating current.

54. The fabrication method of the alternating current light-emitting device of claim 48, wherein the active layers of the micro-dies emit light at different wavelenghths and take turns to emit light during the positive and negative half cycles of alternating current.

55. The fabrication method of the alternating current light-emitting device of claim 42, wherein the conductive terminals are formed by vapor deposition.

56. The fabrication method of the alternating current light-emitting device of claim 42, wherein the conductive terminals are ohmic electrodes.

57. The fabrication method of the alternating current light-emitting device of claim 42, wherein the at least two active layers on the substrate are formed in sequence by epitaxy technology.

58. The fabrication method of the alternating current light-emitting device of claim 42, wherein the plurality of openings are formed in the active layers by lithography and etching.

59. The fabrication method of the alternating current light-emitting device of claim 42, wherein the protective layer is made of a dielectric material.

60. The fabrication method of the alternating current light-emitting device of claim 59, wherein the dielectric material is one of $SiO_x$ and $SIN_x$.

* * * * *

UNITED STATES PATENT AND TRADEMARK OFFICE
CERTIFICATE OF CORRECTION

PATENT NO.         : 7,544,524 B2
APPLICATION NO.    : 11/432366
DATED              : June 9, 2009
INVENTOR(S)        : Ming-Te Lin et al.

Page 1 of 1

It is certified that error appears in the above-identified patent and that said Letters Patent is hereby corrected as shown below:

In claim 5, column 12, line 25, "structure" should read --structures--.

In claim 42, column 14, lines 60-61, "forming on the exposed portions of the substrates in the openings a plurality of conductive structures for" should read --forming a plurality of conductive structures on the exposed portions of the substrate in the openings for--.

In claim 53, column 16, line 3, "wavelenghts" should read --wavelengths--.

In claim 54, column 16, line 8, "wavelenghths" should read --wavelengths--.

Signed and Sealed this

First Day of September, 2009

David J. Kappos
*Director of the United States Patent and Trademark Office*